United States Patent [19]
Chang et al.

[11] Patent Number: 5,477,221
[45] Date of Patent: Dec. 19, 1995

[54] PIPELINE SYNTHETIC APERTURE RADAR DATA COMPRESSION UTILIZING SYSTOLIC BINARY TREE-SEARCHED ARCHITECTURE FOR VECTOR QUANTIZATION

[75] Inventors: Chi-Yung Chang, Torrance; Wai-Chi Fang, San Marino; John C. Curlander, Pasadena, all of Calif.

[73] Assignee: The United States of America as represented by the Administrator of the National Aeronautics and Space Administration, Washington, D.C.

[21] Appl. No.: 44,092

[22] Filed: Mar. 22, 1993

Related U.S. Application Data

[63] Continuation of Ser. No. 550,775, Jul. 10, 1990, abandoned.
[51] Int. Cl.⁶ .................................................. H03M 7/00
[52] U.S. Cl. ............................................. 341/51; 341/79
[58] Field of Search ............................. 341/51, 79, 106, 341/161, 200; 358/21 R; 340/735

[56] References Cited

U.S. PATENT DOCUMENTS

| | | | |
|---|---|---|---|
| 4,670,851 | 6/1982 | Murakami et al. | 364/518 |
| 5,010,401 | 4/1991 | Murakami et al. | 358/136 |

OTHER PUBLICATIONS

C. Y. Chang, et al., "Data Compression of Synthetic Aperture Radar Imagery," JPL D–5210, 1988.
P. R. Cappello, et al., "A Systolic Vector Quantization Processor for Real–Time Speech Coding," Proc. of ICASSP, pp. 2143–2146, Tokyo, 1986.
R. Dianysian, et al., "A VLSI Chip Set for Real–Time Vector Quantization of Image Sequences," Proc. of Int. Symp. on Circuits and Systems, May 1987.
C. Y. Chang, et al., "Systolic Array Processing of the Viterbi Algorithm," IEEE Trans. on Information Theory, vol. 35, No. 1, pp. 76–86, Jan. 1989.

*Primary Examiner*—Brian K. Young
*Attorney, Agent, or Firm*—John H. Kusmiss; Thomas H. Jones; Guy M. Miller

[57] ABSTRACT

A system for data compression utilizing systolic array architecture for Vector Quantization (VQ) is disclosed for both full-searched and tree-searched. For a tree-searched VQ, the special case of a Binary Tree-Search VQ (BTSVQ) is disclosed with identical Processing Elements (PE) in the array for both a Raw-Codebook VQ (RCVQ) and a Difference-Codebook VQ (DCVQ) algorithm. A fault tolerant system is disclosed which allows a PE that has developed a fault to be bypassed in the array and replaced by a spare at the end of the array, with codebook memory assignment shifted one PE past the faulty PE of the array.

4 Claims, 12 Drawing Sheets

FIG. 7a
FROM ARRAY CONTROLLER

PIPELINE SYNTHETIC APERTURE RADAR DATA COMPRESSION UTILIZING SYSTOLIC BINARY TREE-SEARCHED ARCHITECTURE FOR VECTOR QUANTIZATION

ORIGIN OF THE INVENTION

The invention described herein was made in the performance of work under a NASA contract, and is subject to the provisions of Public Law 96-517 (35 USC 202) in which the Contractor has elected not to retain title. This is a continuation of application Ser. No. 07/550,775 filed Jul. 10, 1990, now abandoned.

TECHNICAL FIELD

The invention relates to a systolic array architecture for a Vector Quantizer (VQ) for real-time compression of data to reduce the data communication and/or archive costs, and particularly to a tree-searched VQ.

BACKGROUND ART

Efficient data compression to reduce the data volume significantly decreases both data communication and archive costs. Among existing data compression algorithms, Vector Quantization (VQ) has been demonstrated to be an effective method capable of producing good reconstructed data quality at high compression ratios. The primary advantage of the VQ algorithm, as compared to other high compression ratio algorithms such as the adaptive transform coding algorithm, is its extremely simple decoding procedure, which makes it a great potential technique for the single-encoder, multiple-decoder data compression systems.

The VQ algorithm has been selected as the data compression algorithm to be used for rapid electronic transfer of browse image data from an on-line archive system to end users of the Alaska SAR Facility (ASF) and the Shuttle Imaging Radar C (SIR-C) ground data systems. For this on-line archive application, VQ is required to reduce the volume of browse image data by a factor of 15 to 1 so that the data can be rapidly transferred through the Space Physics Analysis Network (SPAN) having a 9600 bits per second data rate, and be accurately reconstructed at the sites of scientific users.

Another application of the VQ algorithm is the real-time downlink of the Earth Observing System (EOS) on-board processor data to the ground data users. For this data downlink application, VQ is required to reduce the volume of image data produced by the on-board processor by a factor of 7 to 1 so that the data can be transferred at real-time through the direct downlink channel limited at 1 Megabits per second data rate. These flight projects are currently undertaken by the National Aeronautics and Space Administration (NASA) for imaging and monitoring of global environmental changes.

Aside from these space applications, VQ can also be applied to a broad area in commercial industry for data communication and archival applications, such as digital speech coding over telephone lines, High Definition TV (HDTV) video image coding and medical image coding.

Figure 1:
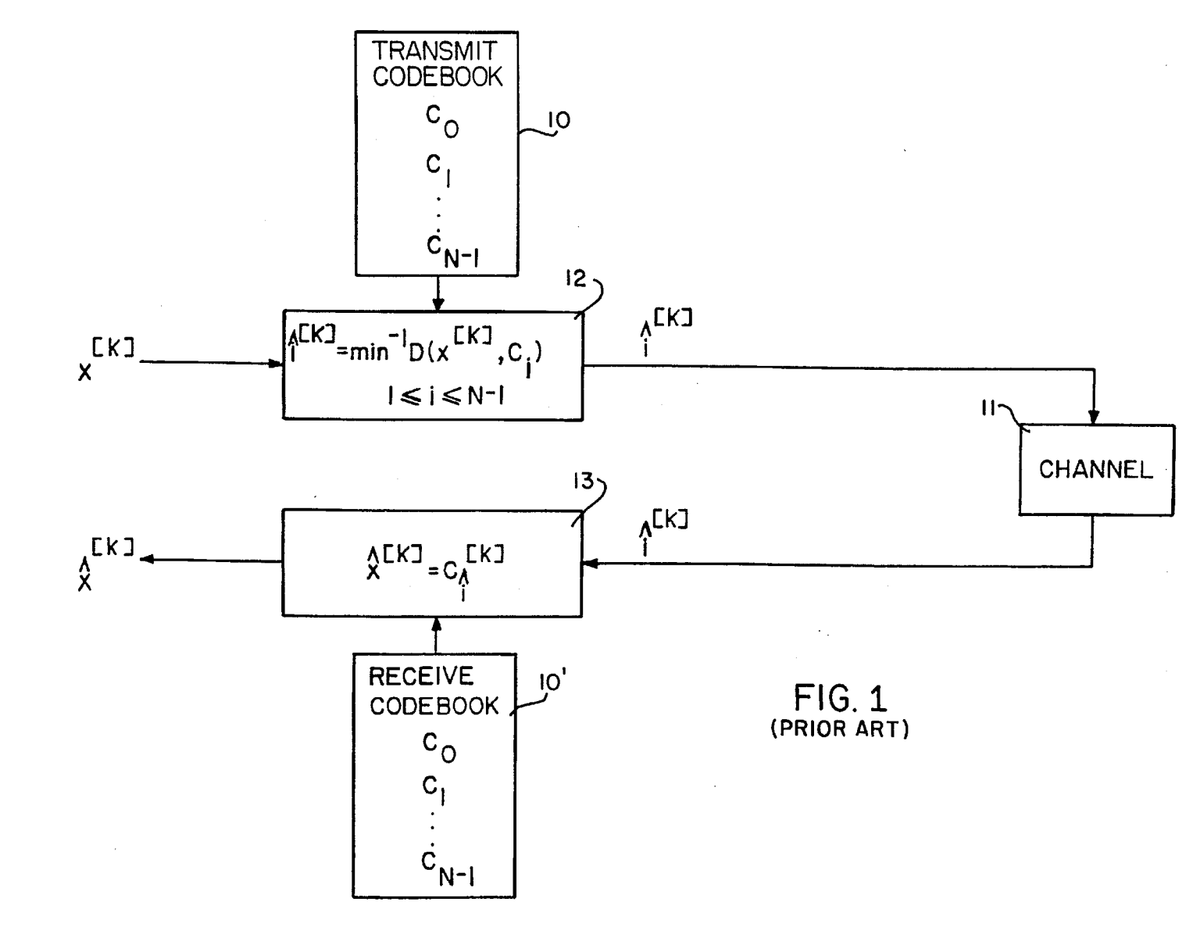
FIG. 1 is a generalized functional block diagram of the prior-art vector quantization (VQ) algorithm.

Vector quantization is a generalization of scalar quantization. In vector quantization, the input data is divided into many small data blocks (i.e., data vectors). The quantization levels (i.e., codevectors) are vectors of the same dimension as the input data vectors. A general functional block diagram for vector quantization is shown in FIG. 1. A codebook 10 comprised of codevectors $C_0, C_1, \ldots, C_{N-1}$, is used at the transmit end of a communication channel 11 for data encoding and a duplicate codebook 10' is used at the receive end for data decoding. An encoding functional block 12 carries out the algorithm indicated by $$\hat{i}^{[k]} = \min^{-1}_{0 \leq i \leq N-1} D(x^{[k]}, c_i), \qquad (1)$$

where: $x^{[k]}$ represents the input data vector at time k; $C_i$ is the codevector; $D(x^{[k]}, C_i)$ is the distortion function; N the total number of codevectors; and $\hat{i}^{[k]}$ the optimal codevector index. The procedure defined by that equation is to select the stored codevector which yields the minimum distortion between an input data vector $x^{[k]}$ and the stored codevectors $C_0, C_1 \ldots, C_{N-1}$. The optimal index $\hat{i}^{[k]}$ transmitted through the channel 11 is used at the receive end for the decoding function in block 13 carried out by using the index $\hat{i}^{[k]}$ to look up the codevector $C_{\hat{i}^{[k]}}$ in the codebook 10' that is then used as the reconstructed data vector $\hat{x}^{[k]}$, which closely approximates the original data vector $x^{[k]}$. The decoding procedure can be expressed as $$\hat{x}^{[k]} = C_{\hat{i}^{[k]}} \qquad (2)$$

which is a table look-up procedure. Data compression is achieved since fewer bits are needed to represent the codevector indices than the input data vectors.

The codebook is generated by training a subset of the source data. The performance of the codebook is highly dependent on the similarity between the training data and the coded data. It then follows that the encoding procedure need only involve computing the distortion between each input data vector and all of the stored codevectors to select the best match. This algorithm is known as the full-searched VQ algorithm.

Figure 2:
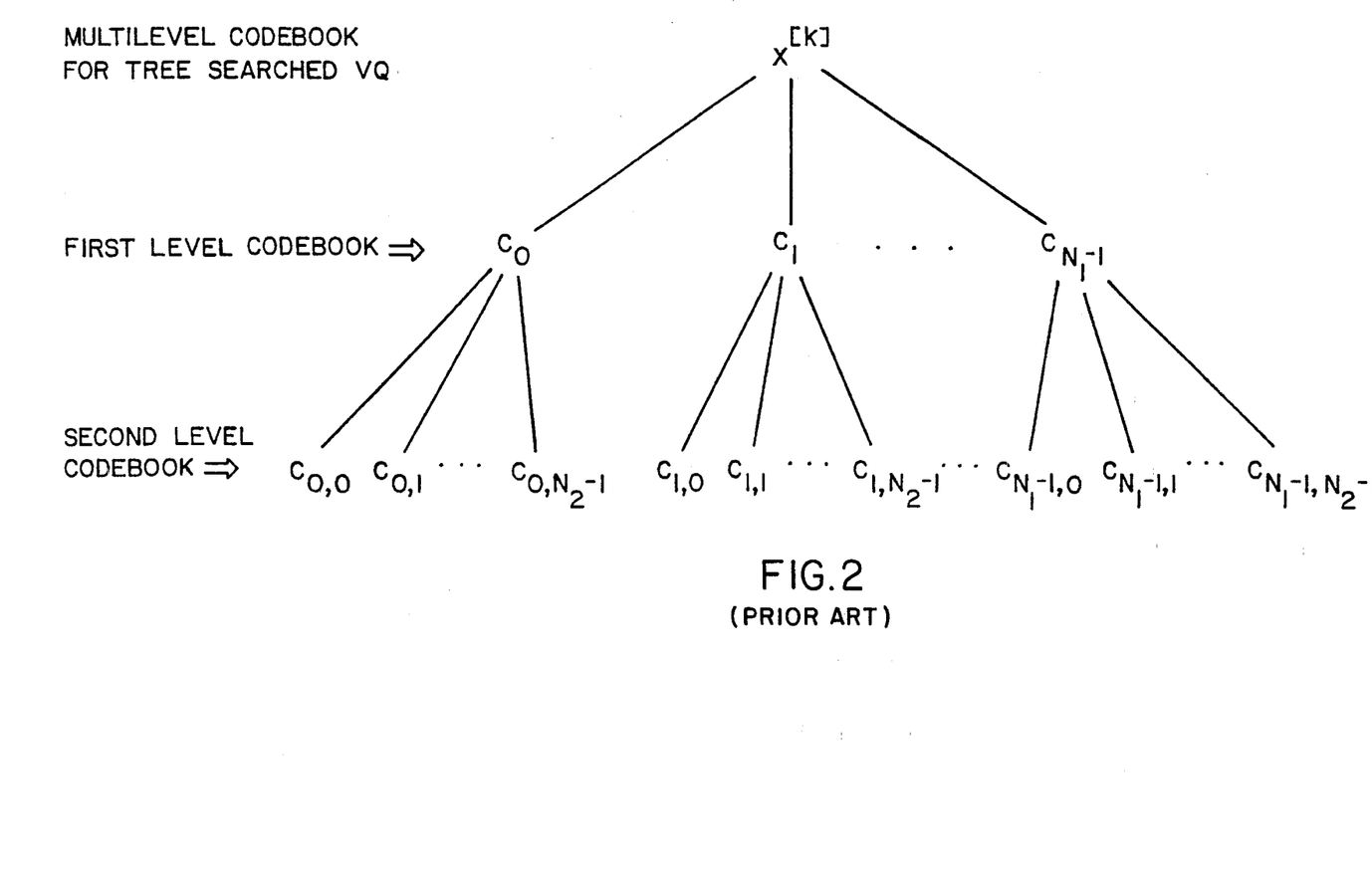
FIG. 2 is a diagram of the prior-art encoding procedure of the 2-level tree-searched vector quantization algorithm.

The major drawback of the full-searched VQ algorithm is the high complexity involved in drawing up (training) the codebook and then data encoding, which poses a great challenge for real-time application. To reduce the encoding complexity, the tree-searched VQ algorithm is employed such that the complexity only grows linearly rather than exponentially as the codebook size increases. For the tree-searched VQ, the codebook is divided into several tree levels, as illustrated in FIG. 2 for a 2-level tree-structured codebook. In the encoding process, the input data $x^{[k]}$ is first compared with the first level codebook $C_0, C_1, \ldots C_{N_1-1}$. Based on the selected codevector, the input data $x^{[k]}$ vector is then compared with the codevectors of the corresponding second level subcodebook $C_{0,0}, C_{0,1} \ldots C_{N_1-1,N_2-1}$. This encoding procedure is repeated until the input data vector is compared with the last level subcodebook. The best matched codevector at the last level subcodebook is then used to represent this input data vector.

STATEMENT OF THE INVENTION

An objective of this invention for real-time data compression is to employ a systolic process in the VQ encoding procedure by taking advantage of the regular data flow pattern inherent in the VQ algorithm, particularly with a tree-searched codebook. By a combination of tree-searched VQ and systolic processing, a high throughput data compressor can be realized at a low hardware cost to meet the real-time rate requirement. This is the main theme of this invention. Thus, the primary objective of this invention is to provide a data compression system that can achieve a real-time encoding rate with small hardware cost utilizing systolic array architecture for a tree-searched VQ algorithm.

The systolic array consists of a network of identical Processing Elements (PE) that rhythmically process and pass data among themselves. It exploits design principles such as modularity, regular data flow, simple connectivity structure, localized communication, simple global control and parallel/pipeline processing functions. The systolic array is an effective architecture for implementation of matrix type computation.

This invention applies the systolic array architecture to both full-searched and tree-searched VQ. Briefly, the encoding procedure of a full-searched VQ can be formulated as a matrix-vector computation in a general form, where the multiply operator represents the scalar distortion computation and the add operator represents the summation of weighted scalar distortions, while the encoding procedure of a tree-searched VQ can be formulated as a series of matrix-vector computations with proper access to codevectors in the subcode-books. Examples are specifically given for a Binary Tree-Searched VQ (BTSVQ) of both a raw codebook and a difference codebook referred to hereinafter as RCVQ and DCVQ, respectively.

A secondary objective of this invention is to provide a fault tolerant systolic VQ encoder by including a spare Processing Element (PE) in a systolic array of PEs and a means for detection and replacement of a faulty PE with the spare PE to enhance the system reliability.

The novel features that are considered characteristic of this invention are set forth with particularity in the appended claims. The invention will best be understood from the following description when read in connection with the accompanying drawings.

DETAILED DESCRIPTION OF THE INVENTION

As noted hereinbefore, Vector Quantization (VQ) is essentially a generalization of scalar quantization. For input image data, the stream of input pixels is divided into vectors (small blocks of pixels, e.g., 4×4 pixel blocks) and for a full-searched VQ, each input data vector is compared with every vector stored in a codebook. The index of the codebook vector of the smallest distortion is chosen as the encoded quantization vector to be transmitted. To reduce the encoding complexity, the tree-searched VQ technique is employed. This technique divides the codebook into levels of subcodebooks of a tree structure as illustrated in the background art section. The input data vector is successively compared with the stored codevectors in the subcodebook levels, i.e., $$t_1^{[k]} = \min^{-1} D(x^{[k]}, C_{i_1}) \quad (3)$$
$$0 \leq i_1 \leq N_1 - 1$$
$$t_2^{[k]} = \min^{-1} D(x^{[k]}, C_{i_1}[k]_{i_2})$$
$$0 \leq i_2 \leq N_2 - 1$$
$$\vdots$$
$$t_L^{[k]} = \min^{-1} D(x^{[k]}, C_{i_1}[k]_{i_2}[k] \ldots t_{L-1}[k]_{i_L})$$
$$0 \leq i_L \leq N_L - 1$$
$$t^{[k]} = t_1^{[k]} t_2^{[k]} \ldots t_L^{[k]}$$

where $x^{[k]}$ is the input data vector sequence, k represents the time index, and the codevector notation is: $C_{i_1}$ for level 1; $C_{i_1 i_2}$ for level 2; and so forth with $C_{i_1 i_2 \ldots i_L}$ for level L. The distortion function is $D(x^{[k]}, C_{i \ldots})$ and the output coded data sequence is $\hat{t}^{[k]}$. The number of bits per input pixel is K and the input vector dimension is m pixels. Decoding is still a table look-up procedure, $$\hat{x}^{[k]} = C_{\hat{t}}[k] = C_{i_1}[k]_{i_2}[k] \ldots _{i_L}[k] \quad (4)$$

The compression ratio is Km/n for a fixed codebook scheme. The codebook memory size is $$(2^{n_1} + 2^{n_1 + n_2} + \ldots + 2^{n_1 + \cdots + n_L})mK \text{ bits,}$$

where $n_i$ represents the subcodevector bit length at level i, $1 \leq i \leq L$ and $N_L = 2^{n_L}$ represents the number of codevectors. The encoding complexity is $$2^{n_1} + 2^{n_2} + \ldots + 2^{n_L}$$

operations per pixel. Compression ratios are more easily controlled by adjusting m (vector dimension) since the variation in n (codebook bit-length) significantly affects the codebook size and the encoding complexity.

The Binary Tree-Searched VQ (BTSVQ) is a special case of tree-searched VQ. For the BTSVQ, the number L of tree-levels is equal to the codebook bit length (n). The encoding of the BTSVQ can be expressed as $$t_1^{[k]} = \min^{-1} D(x^{[k]}, C_{i_1}), \, i_1 = 0, 1 \quad (5)$$

-continued $$t_2^{[k]} = \min^{-1} D(x^{[k]}, C_{i_1 i_2}), i_2 = 0, 1$$

$$t_n^{[k]} = \min^{-1} D(x^{[k]}, C_{i_1 i_2 \ldots i_{n-1} i_n}), i_n = 0, 1$$

$$t^{[k]} = t_1^{[k]} t_2^{[k]} \ldots t_n^{[k]}$$

For an RCVQ, namely a raw-codebook BTSVQ, the distortion computation between the input vector $x^{[k]}$ and the codevectors at the same binary tree level ($C_0$ and $C_1$) is, $$D(x^{[k]}, C_0) = \sum_{j=0}^{m-1} (x^{[k]}(j)^2 + C_0(j)^2) - 2 \sum_{j=0}^{m-1} x^{[k]}(j) C_0(j) \quad (6)$$

$$D(x^{[k]}, C_1) = \sum_{j=0}^{m-1} (x^{[k]}(j)^2 + C_1(j)^2) - 2 \sum_{j=0}^{m-1} x^{[k]}(j) C_1(j)$$

The codebook memory size is $(2^{n+}-2)mK$ bits. The encoding complexity is $2n$ operations per pixel.

For a DCVQ, namely a difference-codebook BTSVQ, the distortion computation between the input vector $x^{[k]}$ and the codevectors at the same binary tree level ($C_0$ and $C_1$) is simplified as follows $$[D(x,C_0) - D(x,C_1)]/2 = \quad (7)$$

$$\sum_{j=0}^{m-1} (C_0(j)^2 - C_1(j)^2)/2 - \sum_{j=0}^{m-1} x^{[k]}(j) [C_0(j) - C_1(j)] =$$

$$\underset{j=0}{\overset{m-1}{\Delta}} - \Sigma x^{[k]}(j) \delta(j)$$

Instead of saving of $C_0(j)$ and $C_1(j)$, the terms, $$\Delta = \sum_{j=0}^{m-1} (C_0(j)^2 - C_1(j)^2)/2 \quad (8)$$

and $\delta(j) = C_0(j) - C_1(j)$ are stored in the subcodebook. The codebook memory size is $(2^n-1) [m(K+1)+(2K+\log m)]$ bits. The encoding complexity is $n$ operations per pixel.

The DCVQ is an improved version of the RCVQ. For the RCVQ, the encoding and hardware complexity is reduced by half of that of the RCVQ. This is a unique characteristic for a BTSVQ.

Systolic Architecture for the Full-Searched VQ

For most distortion measures, such as the weighted mean square error, the vector distortion can be shown as the weighted sum of the scalar distortion, i.e., $$d(i) = D(x, C_i) = \sum_{j=0}^{m-1} w(j) D(x(j), C_i(j)), \quad (9)$$

for $0 \leq i \leq N-1$ and $0 \leq j \leq m-1$, where $x(j)$ represents the $j^{th}$ component of the input data vector, $C_i(j)$ the $j^{th}$ component of the $i^{th}$ codevector, $w(j)$ the weighting factor in the distortion measure, and $d(i)$ the distortion between x and $C_i$. The index of the codevector of the minimum distortion represents the coded data of the input data vector, i.e., $$\hat{i} = \min^{-1} d(i). \quad (10)$$
$$0 \leq i \leq N-1$$

For this class of distortion measure, the encoding procedure of the full-searched VQ shown in Equation (1) can be expressed in a general matrix-vector multiplication form, where the multiply operator represents the evaluation of scalar distortion and the add operator is the summation of the weighted scalar distortions. Therefore, Equation (9) can be systolic processed since matrix type computations are well suited for systolic processing.

Figure 3:
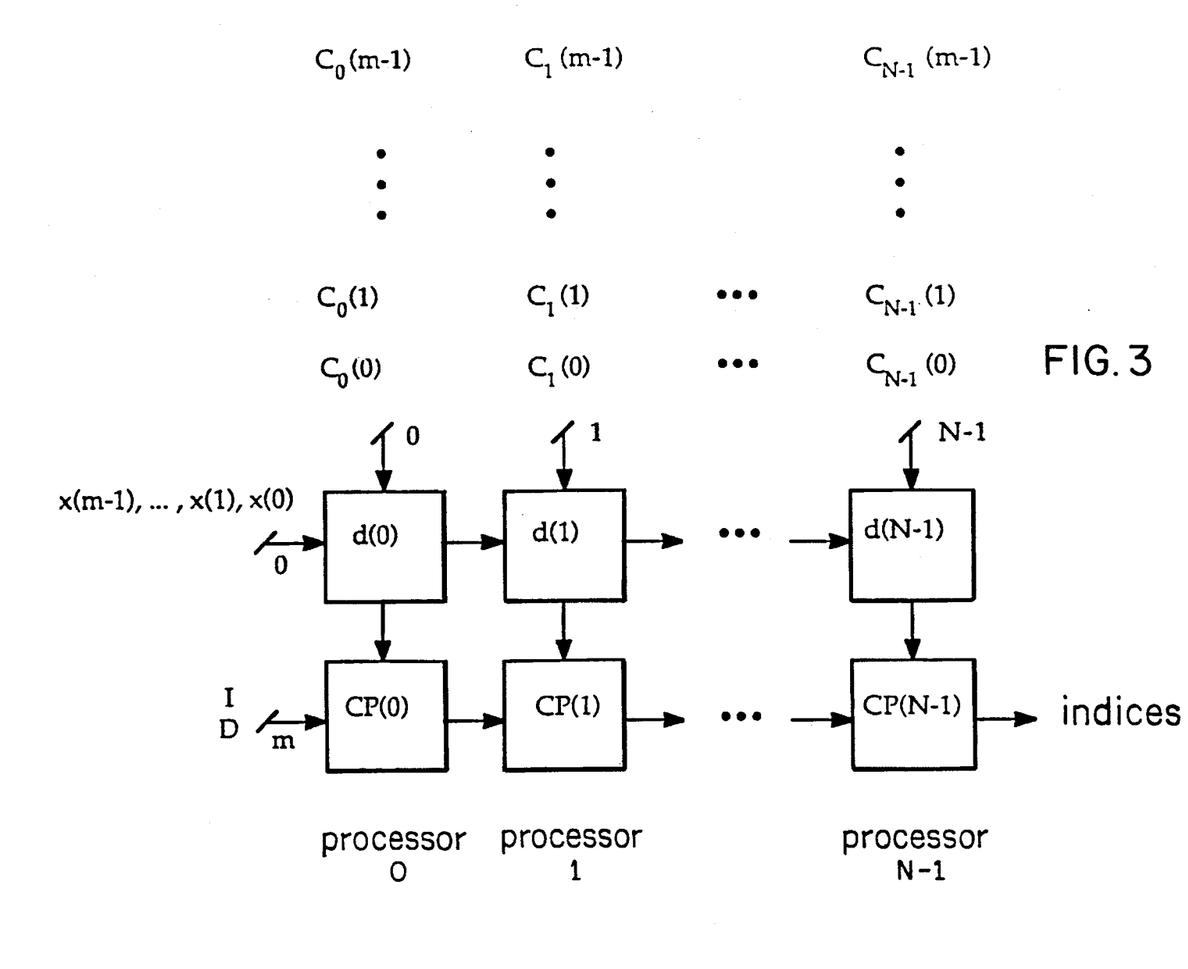
FIG. 3 illustrates a block diagram of a systolic full-search vector quantizer.

A systolic architecture for the full-searched VQ may thus be an array of processors, $0, 1, \ldots, N-1$ and codebooks $0, 1, \ldots, N-1$, each codebook i having a stored codevector comprised of m components $C_i(0), C_i(1), \ldots, C_i(m-1)$, as shown in FIG. 3. The distortion parameter, $d(i)$, is associated with processor i where the distortion is computed, for $0 \leq i \leq N-1$. The parameter $d(i)$ accumulates the intermediate result as the codevector component $C_i(j)$ moves downward and the input data $x(j)$ moves to the right synchronously. After m clock cycles, $d(i)$ will consecutively contain the distortion between the input data vector and the $i^{th}$ Codevector. To perform Equation (9), two variables, I and D, are required to record the index and distortion of the codevector of the current minimum distortion. The variable D is initialized to be a large number. Both I and D enter processor 0 when $d(0)$ is determined. They move down the array one processor per clock cycle. At processor i, D is compared with $d(i)$. If $d(i)<D$, then $I=i$ and $D=d(i)$. As they flow out of processor $N-1$, I will contain the codevector index of the minimum distortion, representing the coded data.

For continuous data encoding, the next data vector with its own pair of I and D follows right after the current data vector so that the data are continuously pumped into the array. This can be achieved by cycling the codevector components $C_i(j)$ into processor i as the input data flows into the array. Each $d(i)$ is reset after the vector distortion is determined.

For this systolic architecture having N processors and N codevectors, and each codevector has m components, the encoding speed is increased by a factor of N over a single processor architecture. The pipeline latency is N+m clock cycles. The throughput rate is constant at 1 pixel/clock for any vector dimension and code book size. Since typically N is chosen to be large to attain good reproduced image quality, a large number of processors are required. Therefore, in accordance with the present invention, by combination of tree-searched VQ and systolic processing, a high throughput VQ encoder can be realized with minimal hardware.

Systolic Architecture for Tree-Searched VQ

Equation (3) shows that the tree-searched VQ encoder is in effect a series of the full-searched VQ encoders. The key is to correctly address the next level subcodebook. This can be realized by tagging the index of the current tree level l to the indices of the previous tree levels $1, 2, \ldots l-1$. The combined indices are then used to address the next level subcodebook $l+1$.

A systolic architecture for the tree-searched VQ is essentially a concatenation of L systolic arrays of the full-searched VQ, where L is the number of tree levels. Each stage l corresponds to one tree level l. The codevectors of each subcodebook are arranged as follows. Codevector components $C_{i_1 \ldots i_l}(j)$ are allocated to processor $i_l$ of the lth stage array. There are $N_1 \ldots N_{l-1} m$ codevector components in each processor of the $l^{th}$ stage array. During the VQ encoding, the codevector components are addressed by the combined indices of the previous stages, $i_1 \ldots i_{l-1}$. For this pipeline architecture the $l^{th}$ stage contains $N_l$ processors, which in total is $$\sum_{l=1}^{L} N_l$$

processors. The pipeline latency is $$\left( \sum_{l=1}^{L} N_l \right) + Lm$$

clock cycles. The system throughput rate is 1 pixel/clock, constant for any tree-structured codebook.

Systolic Architecture for Binary Tree-Search Raw Codebook VQ

Figure 4:
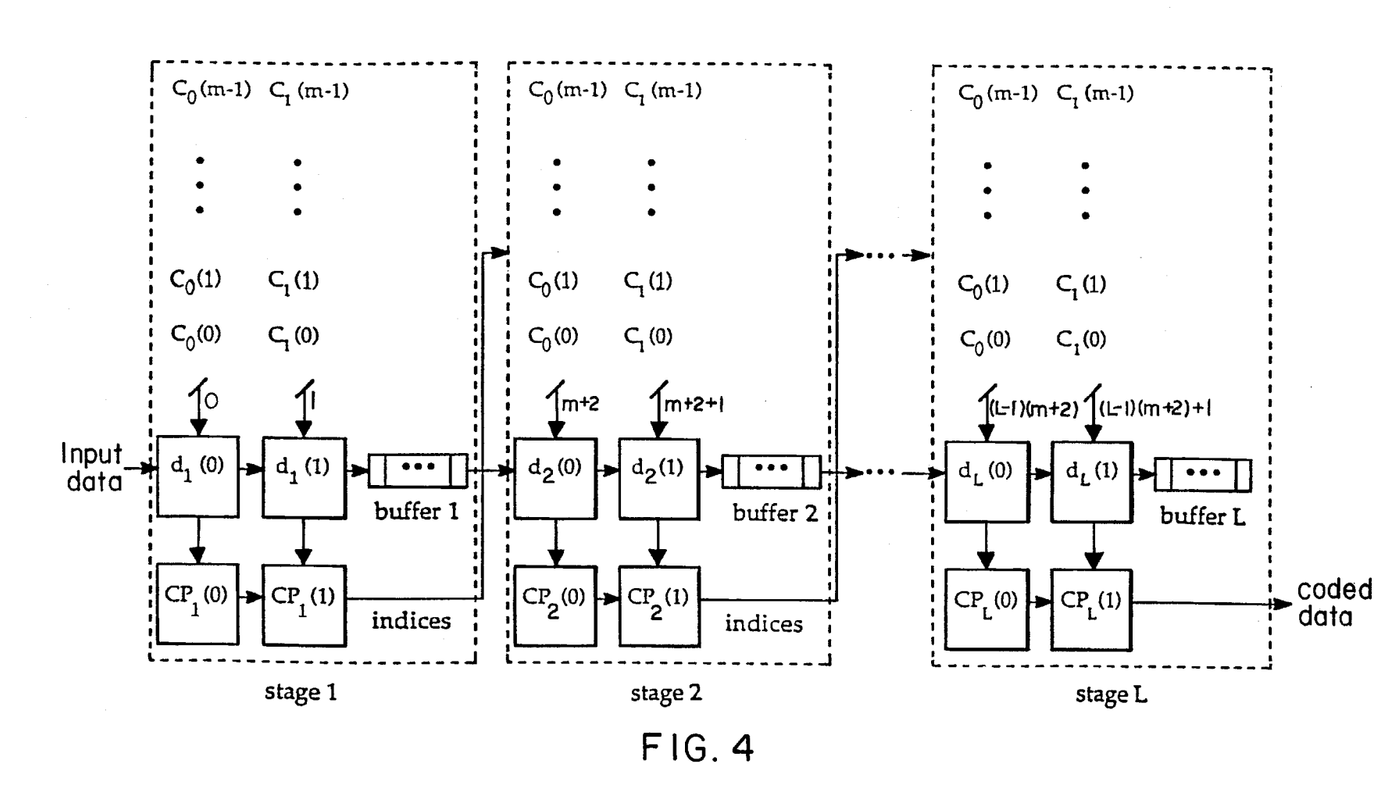
FIG. 4 illustrates a systolic architecture for a Binary Tree-Search Vector Quantizater (BTSVQ).

A systolic architecture for the raw codebook binary tree-searched VQ (RCVQ) defined by Equation (6) is shown in FIG. 4 where the blocks $d_l(0)$ and $d_l(1)$ are distortion computation elements for implementing Equation (6); CP(0) and CP(1) are elements for comparison of the distortion; and buffer elements 1 delay the input data sufficiently to maintain synchronization of the data flow through the pipeline of distortion computation elements with the concatenated indices used to address the next stage l+1 codebooks. The preferred organization of each stage will be described more fully in the next sections.

The input data sequence continuously flows into the array. Note that at each stage the data vector is compared with two codevectors in memory. After the index of the current tree stage (level) is obtained, it is tagged to the indices of the previous tree stages (levels) to address the next stage (level) subcodebook. The index is attained at a rate of one bit per stage. At the end of the array, the concatenated indices, n=L bits in length, are formed to represent the coded data.

Since n=L for the binary tree-searched VQ, the overall system requires 2n processors. The pipeline latency equals n(2+m) clock cycles. The input data rate is 1 pixel per clock cycle, and the output data rate is n bits per m clock cycles. Therefore, the output data rate is effectively reduced by a factor of Km/n, the compression ratio. This systolic architecture of FIG. 4 only requires a small number of processors compared to the full-searched VQ scheme. It has the advantages of modularity, regular data flow, simple interconnection, localized communication, simple global control, and parallel/pipelined processing such that it is well suited for VLSI implementation.

Preferred Design of Systolic Binary Tree-Searched Raw Codebook VQ

Figure 5:
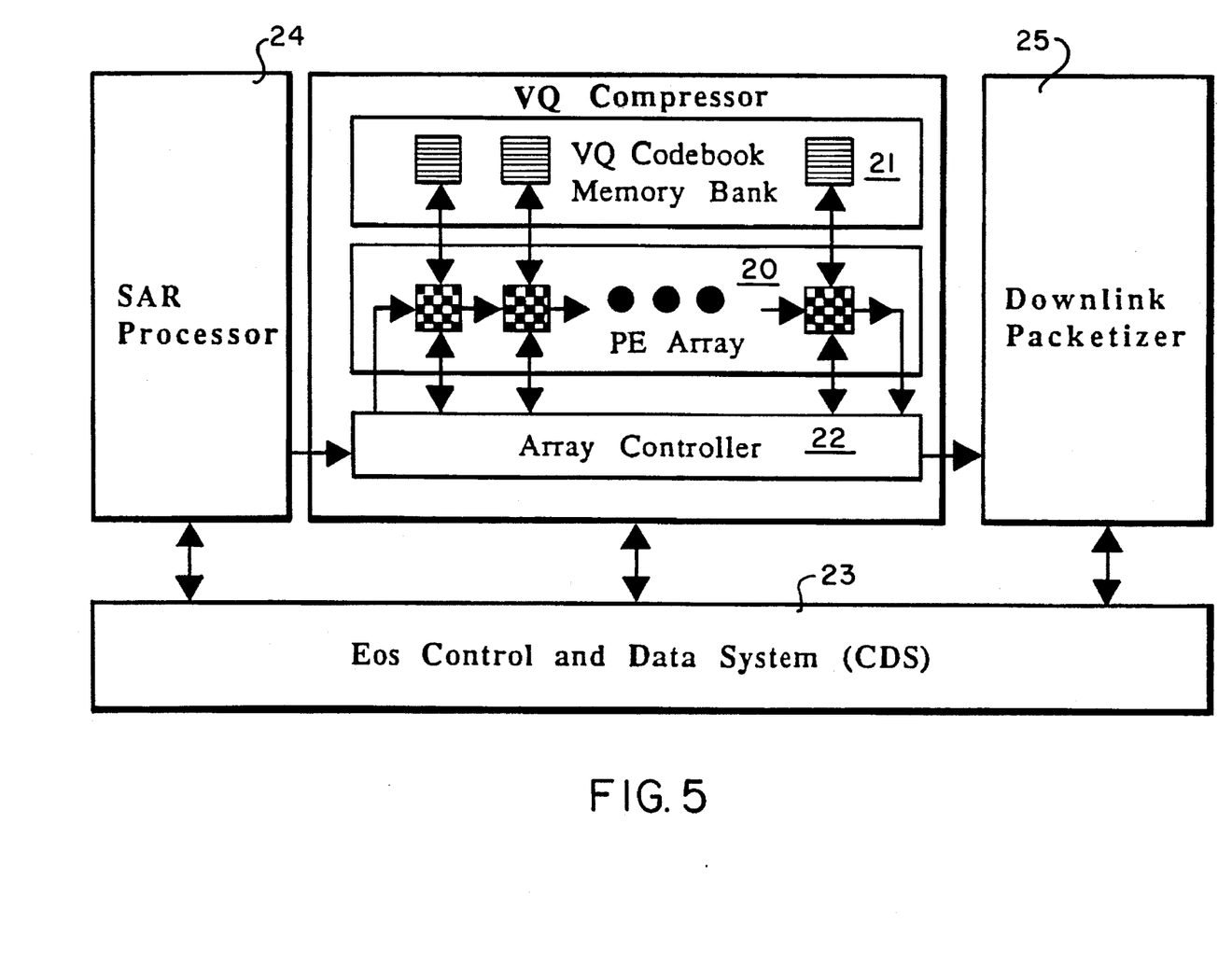
FIG. 5 illustrates major functional blocks of a systolic binary tree-searched VQ encoder as applied to EOS on-board SAR processor.

An example of a preferred design RCVQ which lends itself to VLSI implementation for EOS on-board SAR applications is detailed in this section for a 10-bit codebook of a 4×4 pixel vector dimension. This results in 12.8:1 maximum compression ratio. Limited flexibility in compression ratio can be realized by varying the vector dimension. The mean square error criterion is chosen as the distortion measure. FIG. 5 illustrates the major functional blocks of a systolic binary tree-searched VQ encoder which are the processing element (PE) array 20, the VQ codebook memory banks 21 and an array controller 22, all of which are under synchronized control of an EOS Control and Data System (CDS) 23 as are a SAR processor 24 which presents the serial pixels in digital form and a downlink packetizer 25 which forms packets of VQ data for transmission to a ground station.

Detailed RCPE Design

Figure 6:
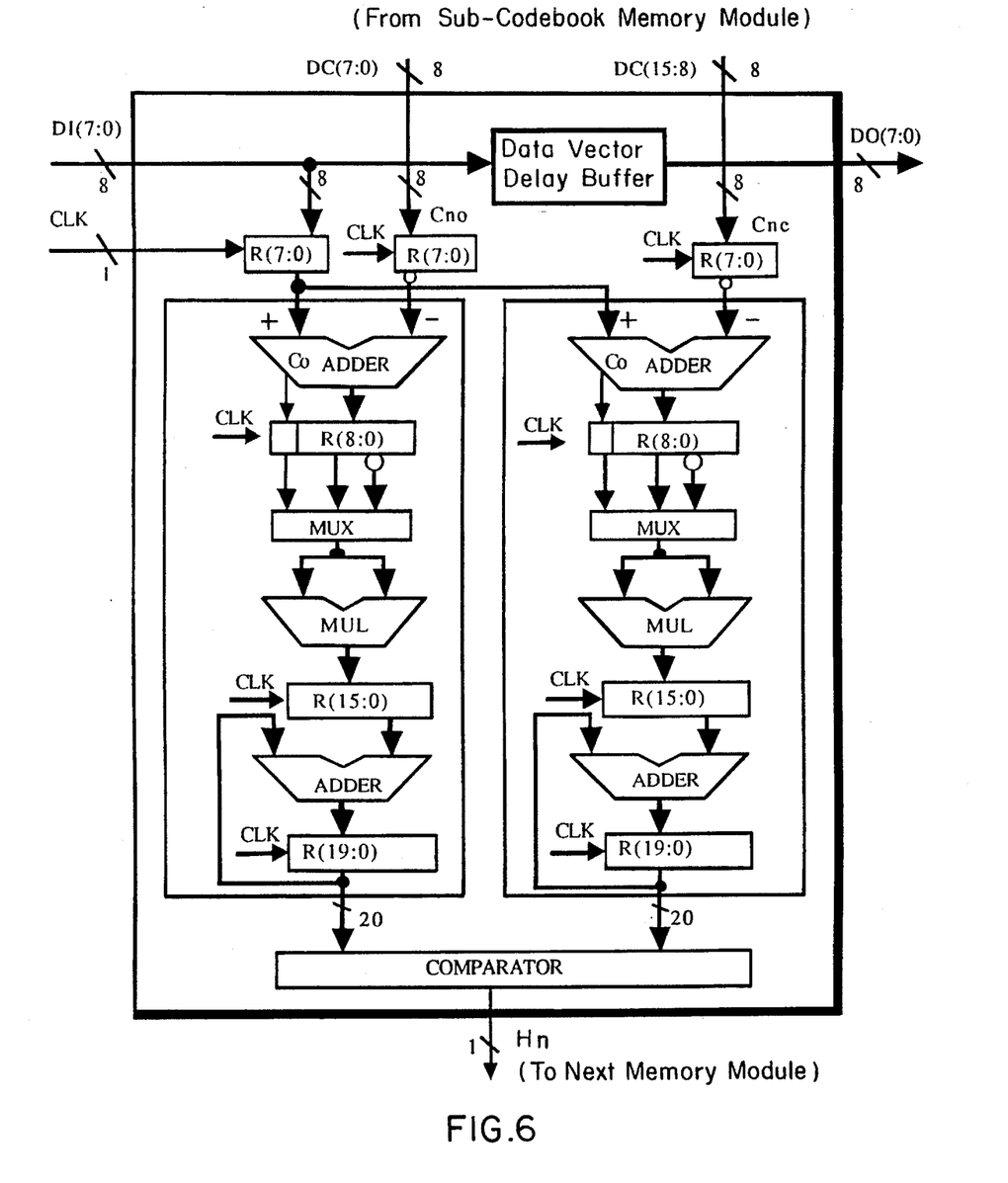
FIG. 6 illustrates a functional block diagram of a BTSVQ Processing Element (PE) in the system of FIG. 5 for RCVQ.

The PE array 20 performs the distortion computation of the VQ algorithm. For a VQ encoder with an n-bit codebook, this can be realized by n identical PEs. FIG. 6 shows a functional block diagram of a PE for a RCVQ. It is designed to compute the mean square error distortion between an input data vector and each codevector pair.

The distortion computing of the raw codebook processing element (RCPE) design is primarily two mean square error operations. During the VQ encoding, the codevector pair components are addressed by the combined indices of the previous PEs $\hat{i}_1, \hat{i}_2 \ldots \hat{i}_{l-1}$. An accumulator accumulates the intermediate result as the codevector pair component $C_1$ and $C_0$ moves downward and the input data x(j) moves to the right synchronously. After m clock cycles, the accumulator will consecutively contain the mean square errors $d_1$ and $d_0$ between the input data vector x and the selected codevector pairs.

The index generator compares the distortion measurement $d_1$ and $d_0$. If $d_1 \geq d_0$ then $\hat{i}_l=0$ else $\hat{i}_l=1$. Index $\hat{i}_l$ is tagged to the indices of the previous tree levels to correctly address the next level subcodebook. At the end of the array, the concatenated indices, n bits in length, are formed to represent the coded data.

The RCPEs are identical, designed to fit into a single chip using VLSI space-qualifiable 1.25 μm CMOS technology. Assessment based on a detailed logic diagram and VLSI layout of the RCPE shows that the gate count is about 3,000 and the pin count about 37, which is well within the capability of present VLSI technology.

Figure 7A:
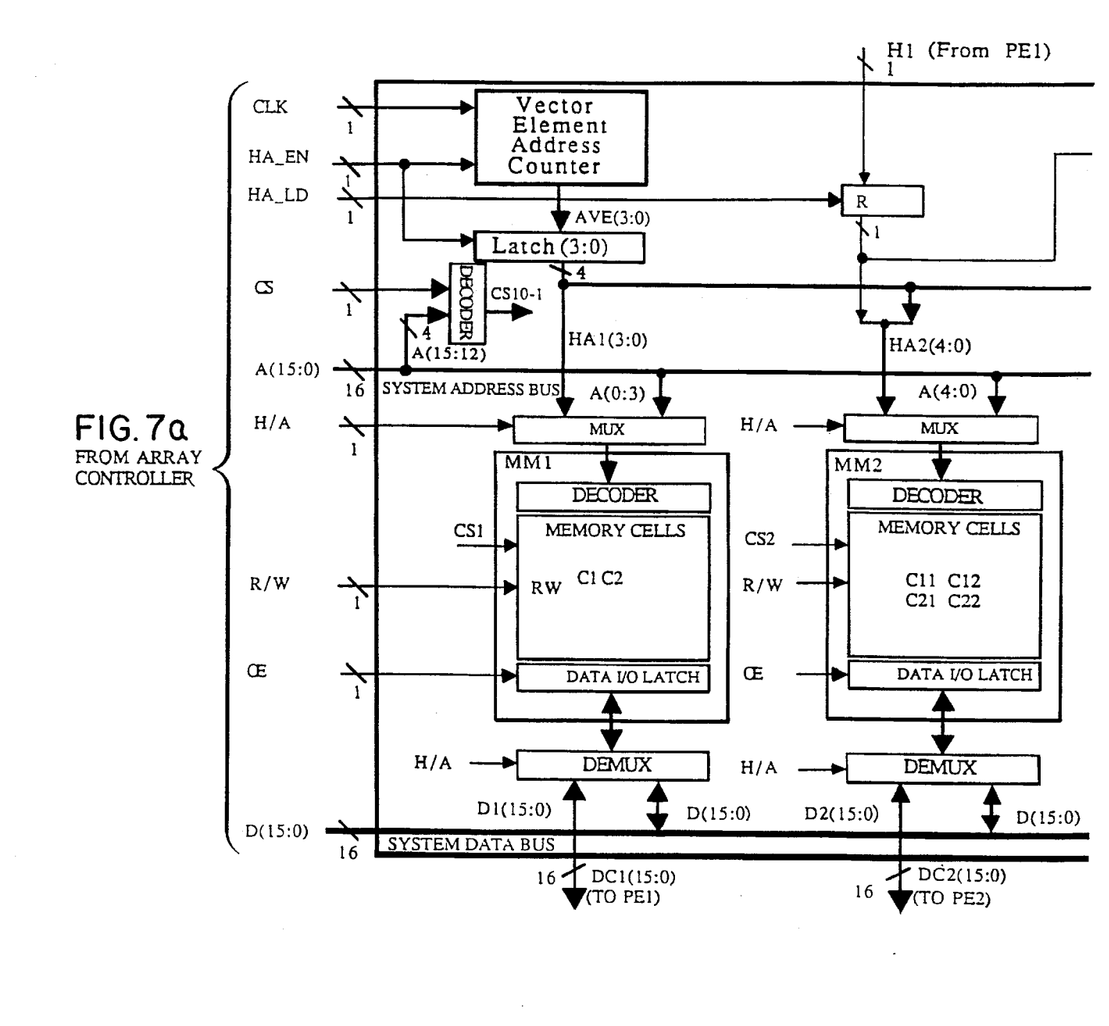
FIGS. 7a and 7b together illustrate a detailed functional design of the memory bank shown in FIG. 5.
Figure 7B:
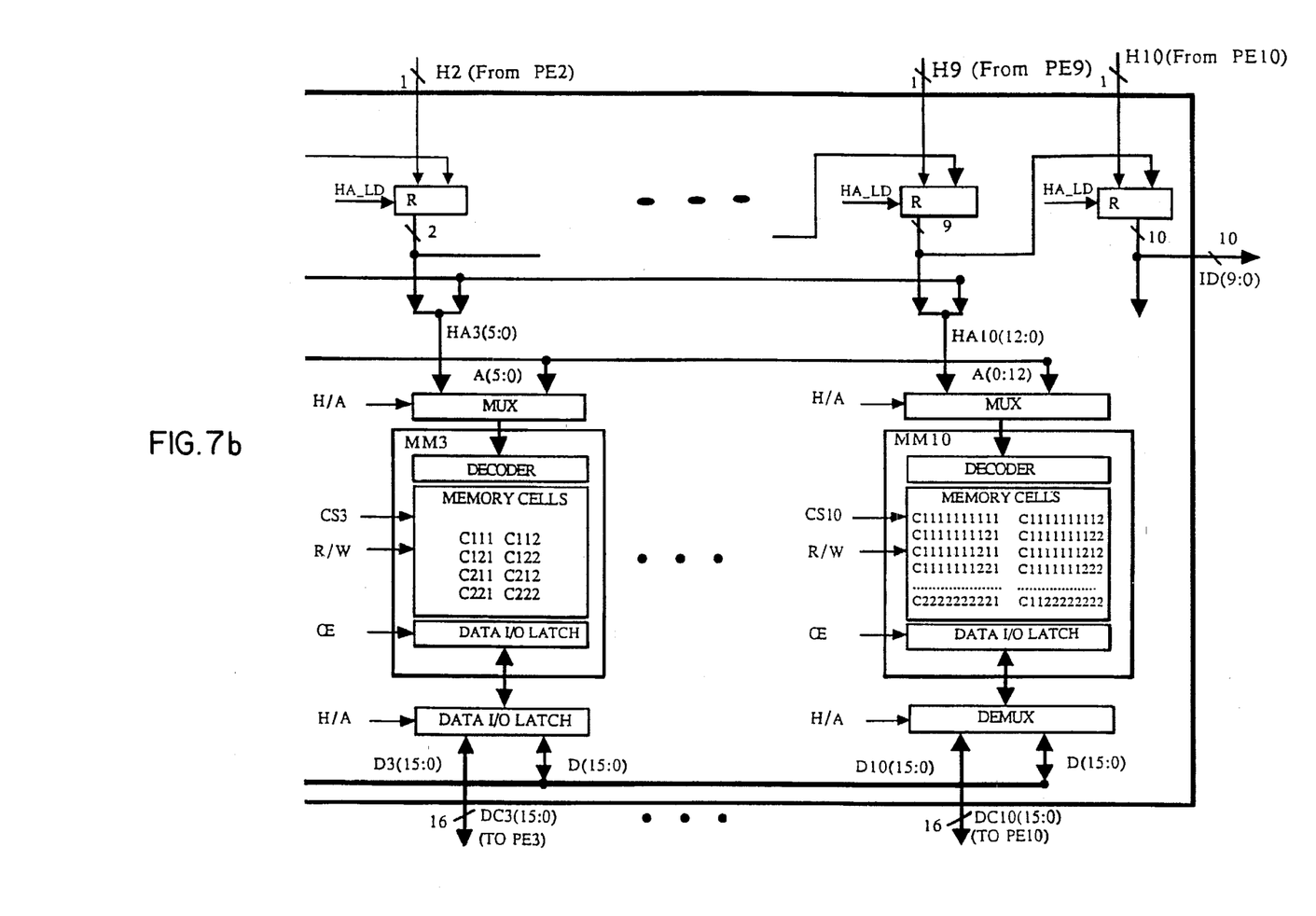

A detailed functional design of an RCPE is shown in FIG. 6. The pin name and definition of the RCPE and associated Memory Bank shown in FIGS. 7a and 7b is summarized in the following table:

| Signal | Type | Description |
| --- | --- | --- |
| MEMORY BANK | | |
| CLK | Input | System clock |
| HA_EN | Input | To enable the pixel address generator |
| HA_LD | Input | To load the hierarchical vector address |
| CS (10:1) | Input | To enable the memory module #1 to #10 |
| A (15:0) | Input | System address bus |
| H/A | Input | To select either system address or hierarchical encoding address |
| R/W | Input | To select either memory read or memory write |
| OE | Input | Tri-state output control |
| D (15:0) | Input | System data bus |
| DCn (15:0) | Output | 16-bit output port of subcodebook #n |
| PROCESSING ELEMENT | | |
| DC (15:0) | Input | Codevector pairs from subcodebook module |
| CLK | Input | System clock (at pixel rate) |
| DI (7:0) | Input | 8-bit input image data |
| DO (7:0) | Output | 8-bit 16-stage pipelined image data |
| Hn | Output | Index of vector generated at PE#n |

Detailed Memory Bank Design

The memory bank is composed of subcodebook memory modules, each storing a VQ subcodebook. FIGS. 7a and 7b show a detailed functional design of the memory bank 21 in FIG. 5. For the binary tree-searched VQ, the n-bit codebook is divided into n(=L for binary tree-searched VQ) hierarchical levels. The codevectors in each level l are stored in their corresponding memory module l. The size of the memory module l is $2^l mK(=2^{l+7})$ bits. The total size of the memory bank is $(2^{n+1}-2)mK(=2^{n+8}-2^8)$ bits. Although the modules of the memory bank differ in size, they assume a regular structure in terms of memory cell design. To enable the programmability of the codebook, the memory bank can be accessed in both read and write modes by the host system 23 of FIG. 5 via the array controller 22 during the initialization. During VQ encoding operation, each memory module can only be accessed to read or write by its associated RCPE. The total size in terms of the primitive memory cell for a 10-bit codebook is $2^{18}$ bits.

Systolic Architecture for Binary Tree-Searched Difference Codebook VQ

Figure 8:
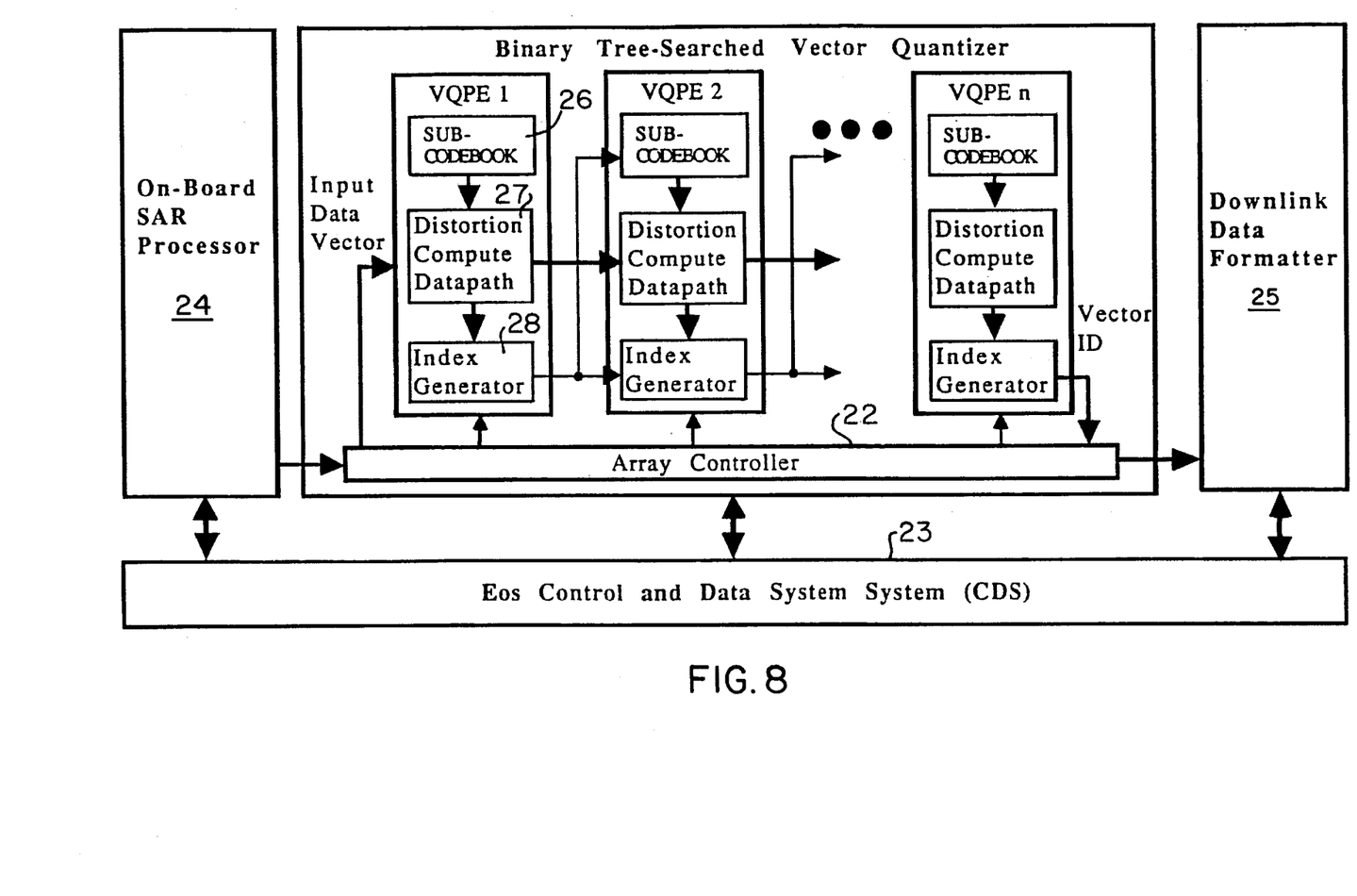
FIG. 8 illustrates a major functional block diagram for a systolic vector quantizer in which each vector quantization processing element has its own codebook memory.
Figure 9:
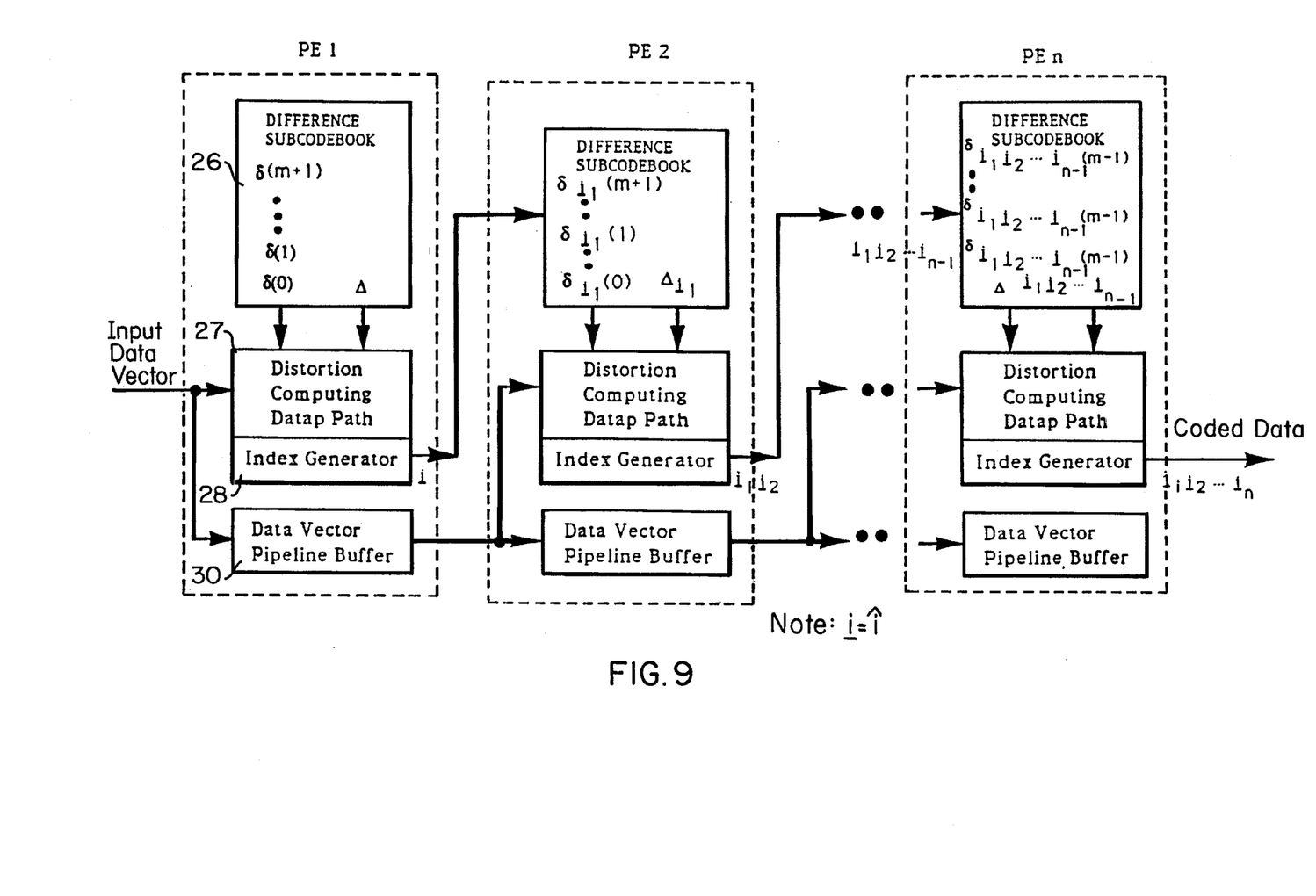
FIG. 9 illustrate the distortion computing data path of the processing elements in the system of FIG. 8.

FIGS. 8 and 9 show the architecture of the systolic array for the difference-codebook BTSVQ. The input data vector sequence continuously flows into the array. For difference-codebook BTSVQ at each stage, the inner product between input data vectors and the difference codevectors is computed and compared with the $2^{th}$ order difference codewords. After the index of the current tree level is obtained, it is tagged to the indices of the previous tree levels to address the next level subcodebook. The index is attained at a rate of one bit per stage. At the end of the array, the concatenated indices of n-bit length are formed and represent the coded data of the corresponding input data vector.

The array controller 22 interprets control parameters from the host system via the on-board SAR processor to set up P-0 the BTSVQ encoder and provides status data for the host system to do house keeping. It also provides the interface timing to upload/download the data among the VQPEs, SAR processor 24 and downlink formatter 25. It also generates timing and control signals to operate the VQPEs 22. The array controller is implemented with a programmable logic array (PLA) device and several data buffers. Due to the localized data/control flow of systolic array processors, the array controller logic is simple.

In this systolic difference codebook BTSVQ, each PE corresponds to one of several binary tree-levels, such as ten numbered 1 through 10 in the example to be described. The major functional blocks of each VQPE1, 2 . . . n of a BTSVQ shown in FIG. 8 are a subcodebook memory 26, distortion computation data path 27 and index generator 32.

For the DCPE of a BTSVQ, an n-bit codebook is divided and converted into n difference subcodebooks. The first-order and second-order differences of each codevector pair in level l are stored in the subcodebook as shown in FIG. 9. The size of difference subcodebook memory of DCPE at level l is $2^{l-1}[m(K+1)+(2K+\log m)]$ bits.

Referring to FIG. 9, the distortion computing datapath 27 of the DCPE design is primarily an inner product operator which is much simpler than the distortion calculator of the RCPE. During the VQ encoding, the difference-codevector components are addressed by the combined indices of the previous PEs, $\hat{i}_1, \hat{i}_2 \ldots \hat{i}_{l-1}$. An accumulator accumulates the intermediate result as the difference-codevector component $\delta(j)$ moves downward and the input data $x(j)$ moves to the right synchronously. After m clock cycles, the accumulator will consecutively contain the inner product $\Delta'$ between the input data vector x and the selected difference codevector.

The index generator compares the $2^{th}$ order difference codeword $\Delta$ with the distortion measurement $\Delta'$. If $\Delta \geq \Delta'$, then $\hat{i}_l=1$ else $\hat{i}_l=0$. Index $\hat{i}_l$ is tagged to the indices of the previous tree levels to correctly address the next level subcodebook. At the end of the array, the concatenated indices, n bits in length, are formed to represent the coded data. The comparator-based index generator makes it easy to perform error detection for PE. However, the subtracter-based index generator has simpler hardware.

Preferred Design of Systolic Binary Tree-Searched Difference Codebook VQ

Figure 10:
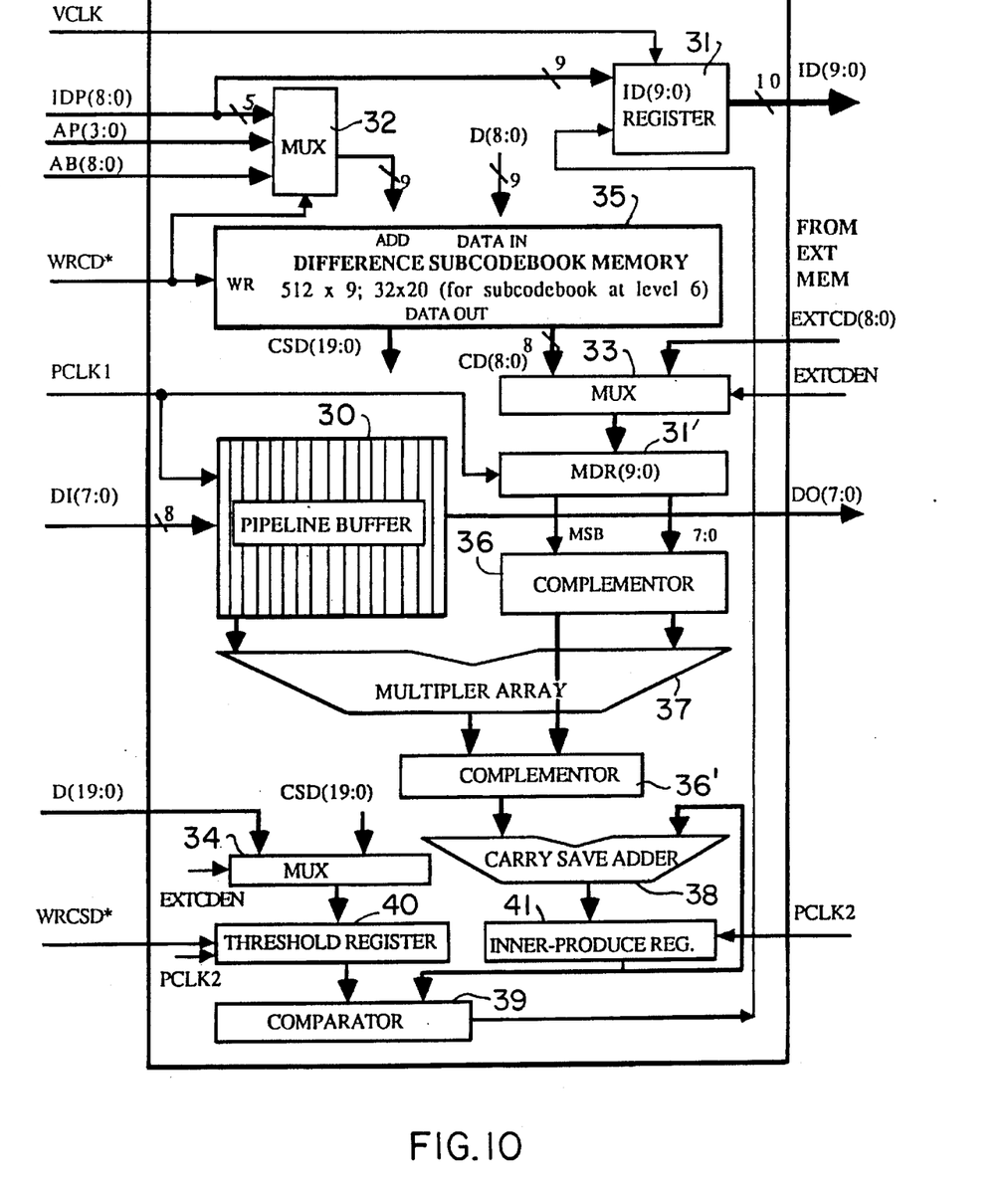
FIG. 10 illustrates a preferred implementation for the processing elements of FIG. 9.

To attain the light-weight, small-volume, and low-power requirements, VLSI technology is preferred for implementation of the DCPE of FIG. 9 as shown in FIG. 10. The building blocks include a pipeline buffer 30, one ID register 31, multiplexers 32, 33 and 34, static RAM array 35, complement or 36, multiplier array 37, carry save adder 38, and comparator 39. The on-chip static RAM array 35 includes a 512×9 RAM and an 32×20 RAM which are used to store the difference subcodebook up to level 6. For levels from 7 to 10, an additional external subcodebook memory is required for each level. An external memory interface is represented by an input EXTCD(8'.0) from external memory to a multiplexer 33 enabled by an input EXTCDEN for levels 7–10. This interface is built as part of each DCPE to support a 10-level systolic BTSVQ encoder with a common VLSI chip for each DCPE.

To enable the programmability, the difference subcodebook memory 35 can be read out of and written into by the host system via the controller 20 (FIG. 8) during the setup mode. While in the encoding mode, each subcodebook memory can only be read out of and written into by its associated PE. In the setup mode, the first-order codevector differences $\delta$ are stored into the subcodebook memory 35. Meanwhile, the second-order codevector differences $\Delta$ are entered and stored in a threshold register 40 of each PE. In the encoding mode, the input vectors, D1(7:0), are received from the on-board SAR processor 24 via the array controller 22.

The PE performs an inner product between the input vectors and the codevector differences. The inner product is stored in a register 41 and compared with the second-order codevector differences $\Delta$ stored in the threshold register 40 at the rising edge of a vector clock VCLK. A one-bit index bit is generated at level l and concatenated with index bits of the previous PEs for lower levels to address the next level l+1 subcodebook. The concatenated index bits of the last PE thus formed represent the coded data for the input data vector x. The pin name and definition of DCPE is summarized in the following table:

| Signal | Type | Description |
|---|---|---|
| VCLK | Input | Vector clock |
| PCLK1 | Input | Pixel clock (phase 1) |
| PCLK2 | Input | Pixel clock (phase 2) |
| AB (8:0) | Input | 9-bit system address bus for subcodebook memory |
| D (19:0) | Input | 20-bit system data bus for subcodebook memory |
| WRCD* | Input | Write enable of subcodebook (active low) |
| DI (7:0) | Input | 8-bit input image data |
| DO (7:0) | Output | 8-bit 16-stage pipelined image data |
| WRCSD* | Input | Write enable of threshold register |
| EXTCD (8:0) | Input | 9-bit codeword from the external subcodebook memory |
| EXTCDEN | Input | To enable multiplexer to accept EXTCD (8:0) |
| AP (3:0) | Input | Address of pixel elements of vectors |
| IDP (8:0) | Input | 9-bit concatenated indices from previous PEs |
| ID (9:0) | Output | 10-bit concatenated indices |

Fault Tolerance Design

For a space mission, it is reasonable to assume a 5 to 10 year unmaintained mission life with a processor reliability goal well above 0.95. A fault tolerant architecture is required to achieve these goals. By combination of architectural fault tolerance and inherent error detection capability, a highly reliable VQ encoder can be attained, such as by a programmed diagnostic routine initiated by the control and data system which supervises the SAR processor, VQ compressor and downlink packetizer. When a fault is detected in any one PE, a "fault" signal is generated and associated with the PE suffering a fault.

Figure 11:
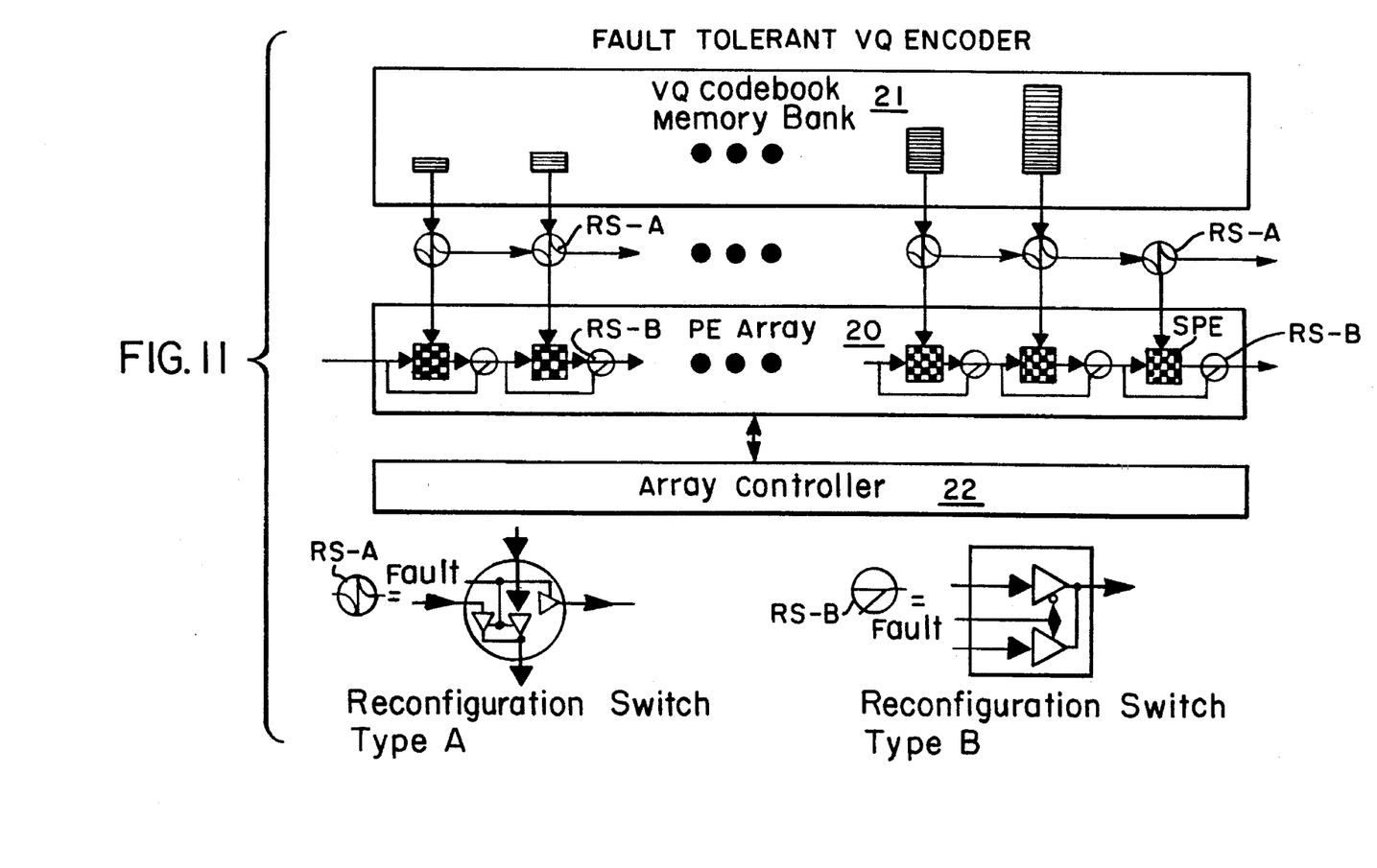
FIG. 11 illustrates fault tolerance augmentation of a systolic vector quantization array using a spare processing element and dynamic reconfiguration switches for replacing a processing element when it is found to have a fault.

As shown in FIG. 11, the linear systolic array of the VQ encoder is augmented with a spare Processing element SPE at the end of the array and dynamic reconfiguration switches (RS). Two switch designs, type RS-A and type B, are presented to support the fault tolerance reconfiguration. If there is a permanent fault in any active PE, the faulted PE will be detected and bypassed by a type RS-B switch at its output. Meanwhile the spare Processing element SPE at the end of the array will be activated by type RS-A switches for all PEs downstream in the array. The spare Processing element SPE is bypassed by a type RS-B switch at its output until called upon to serve. It is at that time that the VQ codebooks of the PEs are all switched starting with the PE having a fault and thus shifting each PE code book to the next PE of the array in a direction from the input end to the output end of the PE array. The reconfiguration switches are controlled by a "fault" signal stored in an array register by the diagnostic subroutine system which conducts the tests for detection of a faulty PE during the set-up time before encoding SAR data for transmissions.

In detecting a fault, a single computation unit (such as multiplier or adder) fault model may be used where it is assumed that at most one PE could suffer a fault within a given period of time which will be reasonably short compared with the mean time between failures. Since effective error detecting and correcting schemes, such as parity and Hamming codes, exist for communication lines and memories, failures in these parts can be readily detected and corrected by those methods. The fault mode concentrates on the permanent failures of a PE.

Two basic mechanisms can be applied to detecting faults in this type of system: on-line concurrent error detection and periodic self-test. On-line single error correction for arithmetic operations can be accomplished by arithmetic codes such as AN code or Residue code. For the EOS SAR processor, temporary distortion of images due to transient faults may be tolerable. Hence second error if any can be detected by periodic self-test which is performed during power-up and periodically during operation by temporarily halting compression of data. For the dual data path (RCPE) implementation, each PE is tested by applying the same input data and codevector to both its paths and use the comparator to determine if the two results are equal or not. If they are not equal, a permanent or a transient fault may exist in the PE. To determine whether it is a transient fault or a permanent fault, the same input and codevector are reapplied following the first detection of error. If the two data paths still generate different results, a permanent fault has been detected and reconfiguration is needed to avoid faulty PE.

For the DCPE design, predetermined test inputs are applied since there is only one data path and precomputed results corresponding to the inputs need to be stored. The comparator then compares the generated results with the stored values. If the two are the same, the PE is fault-free: otherwise, the same input is reapplied to find out whether it is a permanent or transient fault. Following the location of the faulty PE, the spare PE is switched in to maintain the size of the PE array.

The hardware overhead of the self-test and reconfiguration scheme is about 20%. In PE level, the overhead hardware includes two reconfiguration switches, one multiplexer, two registers, two comparators, one flag resister, one n-input OR gate, one control line, n input lines, and one output line. In PE array level, only one spare PE is required.

It has been shown that error correction using arithmetic code is also cost effective. The encoding introduces redundant bits in the number representation. A proportional hardware increase takes place in register array and data path. The estimated hardware overhead is from 20% to 40% which should be able to fit in the PE chip of available die size 300 mils×300 mils.

The reliability improvement can be addressed as follows: If each PE has a reliability of R, then the reliability of 10 PEs is $R^{10}$. For the reconfigurable array with one spare PE, the reliability becomes $R^{11}+11\ R^{10}\ (1-R)$. For example, if R=0.95, the reliability of nonredundant PE array is 0.60 while the reliability of redundant array is 0.90. This represents a 50% increase in reliability.

Conclusion

Although particular embodiments of the invention have been described and illustrated herein, it is recognized that modifications and variations may readily occur to those skilled in the art. Consequently, it is intended that the claims be interpreted to cover such modifications and variations.

We claim:

1. In a systolic-array image processing system, a full-searched vector quantizer for data compression comprising an array of N processors, with N distortion parameters, d(i), one for each processor, and N codevectors stored in a codebook, where each stored codevector $C_i$ comprises m components $C_i(0), \ldots, C_i(m-1)$, said array of N processors processing input image data vectors and codevectors to generate said distortion parameters as a weighted sum of scalar distortion in accordance with the following equation:

$$d(i) = D(x, C_i) = \sum_{j=0}^{m-1} w(j)D(x(j), C_i(j)),$$

where d(i) is the distortion between an input vector x and a stored codevector $C_i$ which is the $i^{th}$ codevector of the codebook, and $D(x,C_i)$ is said distortion parameter as a function of said input vector x and said stored codevector $C_i$ of the $i^{th}$ processor for $0 \leq i \leq N-1$ and $0 \leq j \leq m-1$, where x(j) represents the $j^{th}$ component of the input data vector x, $C_i(j)$ is the $j^{th}$ component of the $i^{th}$ codevector $C_i$ w(j) being the weighting factor in the distortion measure, and wherein an index, $\hat{i}$, of said codevector $C_{\hat{i}}$ of minimum distortion, $\hat{i}=\min^{-1} d(i)$, represents a vector quantization coded data of an input vector, where said index corresponds to the $i^{th}$ processor, $0 \leq i \leq N-1$.

2. In a systolic-array image processing system, a tree-searched vector quantizer for image data compression comprising a series of L systolic arrays of $N_l$ identical processors, and a plurality L of levels of subcodebooks, where l is the tree level index from 1 to L, one level of subcodebooks for each of L systolic arrays, and means for successively comparing an input vector sequence $x^{[k]}$ with stored codevectors in subcodebook levels in search for an output coded data sequence $\hat{i}^{[k]}$ of minimum distortion in accordance with the following equations:

$$\hat{i}_1^{[k]} = \min^{-1} D(x^{[k]}, C_{i_1})$$
$$0 \leq i_1 \leq N_1 - 1$$
$$\hat{i}_2^{[k]} = \min^{-1} D(x^{[k]}, C_{i_1}[k]_{i_2})$$
$$0 \leq i_2 \leq N_2 - 1$$

-continued $$\hat{i}_L^{[k]} = \min^{-1} D(x^{[k]}, C_{i_1[k]i_2[k]\ldots i_{L-1}[k]i_L})$$

$$0 \leq i_L \leq N_L - 1$$

$$\hat{i}^{[k]} = \hat{i}_1^{[k]} \hat{i}_2^{[k]} \ldots \hat{i}_L^{[k]}$$

where $x^{[k]}$ is an input data vector sequence, k represents the time index of said sequence, and the codevector notation is: $C_{i_1}$ for level 1; $C_{i_1i_2}$ for level 2; and so forth with $C_{i_1i_2\ldots i_L}$ for level L, and $i_1$ is a codevector index for tree level-1 subcodebook $i_1, i_2 \ldots i_L$ is a codevector index for tree level-L subcodebook, $D(x^{[k]}C_{i\ldots})$ is a distortion function, and $\hat{i}^{[k]}$ is a vector quantization coded output data sequence of said input vector sequence for binary tree level-l encoding process, $N_l-1$ is the maximum value of said vector coded output data for tree level l, $1 \leq l \leq L$.

3. In a systolic-array image processing system, a binary tree-searched raw codebook vector quantizer for image data compression comprising a series of n systolic arrays of two identical processors and a plurality n of levels of subcodebooks, one level of subcodebooks for each systolic array for successively comparing an input vector sequence $x^{[k]}$ with selected codevector pairs in subcodebook levels in accordance with the following equations:

$$\hat{i}_1^{[k]} = \min^{-1} D(x^{[k]}, C_{i_1}),\ i_1 = 0, 1$$

$$\hat{i}_2^{[k]} = \min^{-1} D(x^{[k]}, C_{i_1i_2}),\ i_2 = 0, 1$$

$$\hat{i}_n^{[k]} = \min^{-1} D(x^{[k]}, C_{i_1i_2\ldots i_{n-1}i_n}),\ i_n = 0, 1$$

$$\hat{i}^{[k]} = \hat{i}_1^{[k]} \hat{i}_2^{[k]} \ldots \hat{i}_n^{[k]}$$

where $x^{[k]}$ is an input vector sequence and k represents the time index of said sequence, and the codevector notation is: $C_{i_1}$ for binary level 1, $C_{i_1i_2}$ for binary level 2, and so forth with $C_{i_1i_2\ldots i_n}$ for level n, $i_1$ is codevector index for binary tree level-1 subcodebook, $i_1i_2$ is codevector index for binary tree level-2 subcodebook, and so forth $i_1i_2 \ldots i_n$ is codevector index for binary tree level-n subcodebook, n is the level number of the deepest binary tree, $D(x^{[k]},C\ldots)$ is a distortion function, $\hat{i}_l^{[k]}$ is a vector quantization coded output data sequence of said input vector sequence for binary tree level-l encoding process and l is a binary tree level index from 1 to n, $\hat{i}^{[k]}$ is a vector quantization coded output data sequence of said input vector sequence for overall encoding process.

4. In a systolic-array image processing system, a binary tree-searched difference codebook vector quantizer for image date compression comprising a series of systolic arrays of identical processors and a plurality of levels of subcodebooks, one level of subcodebooks for each systolic array for successively comparing an input vector with selected codevector pair difference in subcodebook levels in accordance with the following equations:

$$\hat{i}_1^{[k]} = \min^{-1} D(x^{[k]}, C_{i_1}),\ i_1 = 0, 1$$

$$\hat{i}_2^{[k]} = \min^{-1} D(x^{[k]}, C_{i_1i_2}),\ i_2 = 0, 1$$

$$\hat{i}_n^{[k]} = \min^{-1} D(x^{[k]}, C_{i_1i_2\ldots i_{n-1}i_n}),\ i_n = 0, 1$$

$$\hat{i}^{[k]} = \hat{i}_1^{[k]} \hat{i}_2^{[k]} \ldots \hat{i}_n^{[k]}$$

where $x^{[k]}$ is an input vector sequence and k represents the time index of said sequence, and the codevector notation is: $C_{i_1}$ for binary level 1, $C_{i_1i_2}$ for binary level 2, and so forth with $C_{i_1i_2\ldots i_n}$ for level n, $i_1$ is codevector index for binary tree level-1 subcodebook, $i_1i_2$ is codevector index for binary tree level-2 subcodebook, and so forth $i_1i_2 \ldots i_n$ is codevector index for binary tree level-n subcodebook, n is the level number of the deepest binary tree, $D(x^{[k]},C\ldots)$ is a distortion function, $\hat{i}_1^{[k]}$ is a vector quantization coded output data sequence of said input vector sequence for binary tree level-1 encoding process, $\hat{i}^{[k]}$ is a vector quantization coded output data sequence of said input vector sequence for overall encoding process, wherein said distortion function between an input vector $x^{[k]}$ and codevectors at the same binary tree level $C_0$ and $C_1$ are $$D(x^{[k]}, C_0) = \sum_{j=0}^{m-1} (x^{[k]}(j)^2 + C_0(j)^2) - 2 \sum_{j=0}^{m-1} x^{[k]}(j) C_0(j)$$

$$D(x^{[k]}, C_1) = \sum_{j=0}^{m-1} (x^{[k]}(j)^2 + C_1(j)^2) - 2 \sum_{j=0}^{m-1} x^{[k]}(j) C_1(j)$$

$x^{[k]}(j)$ being the $j^{th}$ component of the input vector, j being the component index of the input vector, m being the number of component of the input vector, $C_i(j)$ being the $j^{th}$ component of the $i^{th}$ codevector, i being the codevector index of the codebook, $C_0$ and $C_1$ being the codevector pair of the subcodebook in the same binary tree level, where codebook memory size is $(2^{n+1}-2)nK$ bits, n is a maximum number of tree levels, K is a number of bits per pixel, said distortion computation between input vector $x^{[k]}$ and codevectors at the same binary tree level $C_0$ and $C_1$ is simplified as follows:

$$[D(x, C_0) - D(x, C_1)]/2 = \sum_{j=0}^{m-1} (C_0(j)^2 - C_1(j)^2)/2 -$$

$$\sum_{j=0}^{m-1} x^{[k]}(j) [C_0(j) - C_1(j)] = \Delta - \sum_{j=0}^{m-1} x^{[k]}(j) \delta(j)$$

and instead of saving $C_0(j)$ and $C_1(j)$, the terms, $$\Delta = \sum_{j=0}^{m-1} (C_0(j)^2 - C_1(j)^2)/2$$

and $\delta(j) = C_0(j) - C_1(j)$ are stored in said codebook, where codebook memory size is $(2^n - 1) [m(K+1)+(2K+\log m)]$ bits.

* * * * *